(12) United States Patent
Guidotti et al.

(10) Patent No.: US 7,482,667 B2
(45) Date of Patent: Jan. 27, 2009

(54) EDGE VIEWING PHOTODETECTER (75) Inventors: Daniel Guidotti, Atlanta, GA (US);
Gee-Kung Chang, Smyrna, GA (US);
Jae-Hyun Ryou, Smyrna, GA (US);
Russell Dean Dupuis, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 192 days.

(21) Appl. No.: 11/359,793

(22) Filed: Feb. 22, 2006

(65) Prior Publication Data

US 2006/0186503 A1    Aug. 24, 2006

Related U.S. Application Data

(60) Provisional application No. 60/655,623, filed on Feb. 23, 2005.

(51) Int. Cl.
*H01L 31/00* (2006.01)
(52) U.S. Cl. .................. 257/458; 257/461; 257/466; 257/E31.061
(58) Field of Classification Search .................. 257/458, 257/461, 466, E31.061, E31.128
See application file for complete search history.

(56) References Cited

U.S. PATENT DOCUMENTS

| | | | |
|---|---|---|---|
| 6,020,620 A | 2/2000 | Kusakabe | 257/436 |
| 6,157,759 A | 12/2000 | Seo et al. | 385/49 |
| 6,396,115 B1* | 5/2002 | Gage et al. | 257/432 |
| 6,483,098 B1* | 11/2002 | Kato et al. | 250/214.1 |
| 6,690,079 B2 | 2/2004 | Fujimura et al. | 257/460 |
| 2002/0084505 A1 | 7/2002 | Furuya et al. | 257/466 |
| 2003/0010904 A1 | 1/2003 | Luo | 250/227.11 |
| 2005/0145965 A1* | 7/2005 | Yang et al. | 257/432 |

OTHER PUBLICATIONS

Takeshi Takeuchi et al., "A Planar Slab-Waveguide Potodiode with a Pseudowindow Region in Front of the Waveguide," IEEE Photonics Technology Letters, vol. 10, No, 2, Feb. 1998, pp. 255-257.
V. Magnin et al., "Numerical study of polarization-selective side-illuminated pin photodetectors grown on InP substrate for hybridization on silicon platform," IEE Proc.-Optoelectron, vol. 151, No. 3, Jun. 2004, pp. 171-176.

(Continued)

*Primary Examiner*—Tuan N. Quach
(74) *Attorney, Agent, or Firm*—Merchant & Gould (57) ABSTRACT

An edge viewing semiconductor photodetector may be provided. Light may be transmitted through an optical fiber conduit comprising a core region surrounded by a cladding region. The light may be received at the edge viewing semiconductor photodetector having an active area. The active area may be substantially contained within a first plane. The edge viewing semiconductor photodetector may further have conducting contact pads connected to the active area. The contact pads may be substantially contained within plural planes. The first plane may have its normal direction substantially inclined with respect to a normal direction of the plural planes. The first plane may further have its normal direction substantially inclined with respect to a direction of the received light incident to the active area. Next, a signal may be received from the pads. The signal may correspond to the transmitted light.

20 Claims, 12 Drawing Sheets

OTHER PUBLICATIONS

Chyi-Da Yang et al., "Edge-Coupled InGaAs PIN Photodiode with a Light Funnel Waveguide," IEEE Journal of Quantum Electronics, vol. 40, No. 11, Nov. 2004, pp. 1607-1613.

Vincent Magnin et al., "Design, Optimization, and Fabrication of Side-Illuminated p-i-n Photodetectors with High Responsivity and High Alignment Tolerance for 1.3- and 1.55-μm Wavelength Use," Journal of Lightwave Technology, vol. 20, No. 3, Mar. 2002, pp. 477-488.

Hideki Fukano et al., "High-Responsivity and Low-Operation-Voltage Edge-Illuminated Refracting-Facet Photodiodes with Large Alignment Tolerance for Single-Mode Fiber," Journal of Lightwave Technology, vol. 15, No. 5, May 1997, pp. 894-899.

Sadao Adachi et al., "Chemical Etching Characteristics of (011)GaAs," J. Electrochem. Soc.; Solid-State Science and Technology, vol. 130, No. 12, Dec. 1983, pp. 2427-2435.

PCT International Search Report dated May 8, 2008 cited in International Application No. PCT/US06/06453.

* cited by examiner

EDGE VIEWING PHOTODETECTER

RELATED APPLICATION

Under provisions of 35 U.S.C. § 119(e), Applicant claims the benefit of U.S. provisional application No. 60/655,623, Filed Feb. 23, 2005, which is incorporated herein by reference.

BACKGROUND

Photodetectors (PDs) are physical devices that are used to measure light's presence by converting energy contained in a light quantum (i.e. a photon) into an electrical form that is easier to measure, amplify, and quantify. The energy conversion process may be indirect in which many photons over a period of time generate a detectable heat amount. The heat is then converted to an electrical signal by a thermocouple junction or a resistive bolometer or other thermodynamic processes. The energy conversion process may, in contrast, be direct in that one light quantum or photon causes temporary matter ionization by removing an electron from a chemically bound state to a free vacuum state. The damaged bond may or may not migrate among neighboring atoms, but may eventually be restored to a full bonding state, although there are exceptions such as f-centers in halide salts.

If the PD is a vacuum photomultiplier tube and an incident photon has sufficient energy, an electron may be ejected from the anode surface and may be collected by an accelerating potential in vacuum. The accelerated electron may collide with other anode surfaces to create an electron avalanche which may be registered electrically as a quantity of charge. The net directional movement of many such charge quanta gives rise to an electric current that can be interpreted as information.

If the PD is a semiconductor device, the ionization process is said to be internal and both the ionized electron and the damaged bond are mobile and can move by scattering from one atom to another in a well ordered crystal lattice. Because the electron and damaged bonding state necessarily have opposite electrical charge, they drift in opposite directions in an electric field. Each contributes to the electrical current generated by an incident stream of ionizing photons. The damaged bond carries a positive charge and is referred to as a "hole". The electron carries a negative charge. A "hole" current as well as an electron current can be characterized.

PDs available today for the rapid transport of information are the semiconductor type. Semiconductor PDs work on the quantum energy conversion principle described above, with variations designed to improve amplification, light detection efficiency, and fast response to a burst of photons. For example, an inhomogeneous semiconductor junction suffices to effectively separate and collect photo-generated electron-hole current, but is not optimized. An avalanche photodiode (APD) offers greater sensitivity because, the initial ionization charge created by a sufficiently energetic incident photon is amplified by using an electric field acceleration and charge amplification process within the semiconductor that is similar to that occurring in a vacuum photomultiplier tube discussed above. Resonance cavity enhanced (RCE) PDs utilize an enhanced back-side reflection structure to record as much light as possible. A metal-semiconductor junction is an inhomogeneous semiconductor junction that is generally referred to as a "Schottky" junction and is also effective in collecting photo-ionization current that is generated in the semiconductor substrate. The metal-semiconductor-metal (MSM) PD works on the principle of the Schottky junction and is designed primarily for speed.

The P-I-N structure is the basic semiconductor junction structure prevalent today in optical communication and is a good compromise between high speed and good detection efficiency. PDs that have the P-I-N structure are called P-I-N PDs. In P-I-N PDs, the semiconductor ionization and electron-hole generation process occurs in a first chemically pure or intrinsic-type semiconductor layer. A second semiconductor layer is purposely contaminated with atoms that come to equilibrium in the same or similar semiconductor crystal lattice by releasing a spare, mobile electron that is shared by all the atoms. This spare atom is said to occupy states in the conduction band. This second semiconductor layer is called the "n-type" layer. A third semiconductor layer is purposely contaminated with atoms that come to equilibrium in the same or similar semiconductor crystal lattice by trapping electrons from lattice atoms in order to form stable bond. The resulting unpaired bond has a positive charge that is shared by all the atoms and is said to occupy states in the valence band. The third semiconductor layer is called the p-type layer.

Due to the periodic nature of the crystal potential, crystalline semiconductors, metals, and insulators are characterized by bands of states that are distinguished only by small increments of energy and momentum. In addition, crystalline potentials promote the appearance of regions of energy in which stable states are forbidden. This energy distribution is in sharp contrast to the discrete nature of energy states in isolated atoms. Bonding states occupy the valence band and un-bound electrons occupy the conduction band. Separating the two bands is a band-gap in which no stable states exist. In metals, electronic states overlap energetically with the conduction band and the metal is conductive. In semiconductors, when electronic states overlap with the conduction band, the semiconductor is n-type. When hole states, or shared unpaired bonds, overlap energetically with the valence band, the semiconductor is p-type. When the semiconductor is intrinsic or uncontaminated, there are few mobile electrons and holes, only those that are thermodynamically generated by the sample temperature, and the semiconductor is a poor conductor. Crystalline insulators can be characterized as having an energetically high conduction band.

Waveguide-type P-I-N designs are represented in the publication by Vincent Magnin, et al., in the Journal of Lightwave Technology, Vol. 20, p. 477 (2002). These have rapid response when the intrinsic-type region is very narrow, typically ½ to 1 μm in thickness. Unfortunately, this means that the semiconductor waveguide used to channel light into the detection i-type region is the same thickness and unable to collect sufficient light from an optical fiber or polymer waveguide whose core dimensions are typically 9 μm to 50 μm. In this situation, most of the light is lost. This design type has little sensitivity at high speed. If a much thicker semiconductor waveguide is used to channel more light into the detection i-type region, the waveguide-type P-I-N design will have increased sensitivity, but will have a much slower temporal response. This is because the electrons and holes that are photo generated in the intrinsic or undoped-type layer, having a finite field drift velocity, will take a longer time to travel to the p-type and n-type sides and be recorded as a current.

Refraction-type P-I-N designs are represented in the publication by Hideki Fukano et al., in the Journal of Lightwave Technology, Vol. 15, p. 894 (1997). These designs rely on using an oblique light entry facet and Snell's law to guide light to a P-I-N photo-ionization and charge collection region that is located on a different surface. The oblique surface makes a substantial angle with the travel direction for the incoming light and with the planar surfaces containing the P-I-N layer structure and electrical contact pads. Generally, the incident light emanates from a semiconductor laser, optical fiber, or optical waveguide and is usually diverging. Consequently, the oblique surface has to be in close proximity to the area containing the P-I-N layers, referred to as the active area. If the active area is small, as it must be in order to minimize capacitance and promote rapid temporal response, then much of the light incident on the refraction surface will miss the active area and will not be registered, reducing the sensitivity of the refraction-type. If the active area is enlarged in order to collect more of the refracted light, then the speed of the PD is lowered.

SUMMARY

An edge viewing PD may be provided. This Summary is provided to introduce a selection of concepts in a simplified form that are further described below in the Detailed Description. This Summary is not intended to identify key features or essential features of the claimed subject matter. Nor is this Summary intended to be used to limit the scope of the claimed subject matter.

In accordance with one embodiment, a system for providing light detection comprises a contiguous semiconductor volume; a plurality of surface area segments on the contiguous semiconductor volume, at least one of the plurality of surface area segments being optically active and at least one of the plurality of surface area segments being adjacent to the at least one of the plurality of surface area segments; at least one intersection angle between the at least one of the optically active plurality of surface area segments and the at least one of the adjacent plurality of surface area segments respectively, none of the at least one intersection angle being substantially equal to one of the following: 0 degrees, 90 degrees, and 180 degrees; and at least one electrically conductive line connected to an electrically active area on the at least one of the optically active plurality of surface area segments and extending to the at least one of the plurality of surface area segments being adjacent to the at least one of the plurality of surface area segments.

According to another embodiment, a method for measuring light comprises transmitting light through a polymer waveguide conduit comprising a core region surrounded by a cladding region, receiving the light at a semiconductor photodetector having an active area, the active area being substantially contained within a first plane, the semiconductor photodetector further having conducting contact pads connected to the active area, the contact pads being substantially contained within plural planes, the first plane having its normal direction substantially inclined with respect to a normal direction of the plural planes, the first plane further having its normal direction substantially inclined with respect to a direction of the received light incident to the active area, and receiving a signal from the pads, the signal corresponding to the transmitted light.

According to yet another embodiment, a method for measuring light comprises transmitting light through an optical fiber conduit comprising a core region surrounded by a cladding region, a "V"-shaped or "U"-shaped groove for directing and stabilizing the optical fiber, receiving the light at a semiconductor photodetector having an active area, the active area being substantially contained within a first plane, the semiconductor photodetector further having conducting contact pads connected to the active area, the contact pads being substantially contained within plural planes, the first plane having its normal direction substantially inclined with respect to a normal direction of the plural planes, the first plane further having its normal direction substantially inclined with respect to a direction of the received light incident to the active area, and receiving a signal from the pads, the signal corresponding to the transmitted light.

In accordance with yet another embodiment, a photodetector comprises a heteropolar semiconductor, an active area, at least one polar plane on the heteropolar semiconductor wherein the active area residing on the at least one polar plane of the heteropolar semiconductor, and electrical contact pads making electrical contacts to the active area.

Both the foregoing general description and the following detailed description provide examples and are explanatory only. Accordingly, the foregoing general description and the following detailed description should not be considered to be restrictive. Further, features or variations may be provided in addition to those set forth herein. For example, embodiments may be directed to various feature combinations and subcombinations described in the detailed description.

BRIEF DESCRIPTION OF THE DRAWINGS

The accompanying drawings, which are incorporated in and constitute a part of this disclosure, illustrate various embodiments of the present invention. In the drawings.

DETAILED DESCRIPTION

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

An edge viewing PD may be provided. Consistent with embodiments of the present invention, a method for detecting light that may be propagating in a plane that may be parallel to plane(s) containing a PD's electrical contact pads is provided. The light entry area on the light entry and detection facet, or the facet containing the P-I-N layer structure, can be constructed to be any desired dimension and may be oriented at a substantial angle with respect to the plane(s) containing the electrical contact pads.

Consistent with embodiments of the invention, a new edge viewing PD (EVPD) class in which a light entry and detection facet containing a P-I-N layer structure may be formed on a "mesa" structure sidewall formed, for example, in a semiconductor substrate. The mesa structure may be defined by an anisotropic liquid etching process and may form an atomic surface that may be suitable for hetero-junction epitaxial layer growth by metallo-organic chemical vapor deposition (MOCVD) or molecular beam epitaxy (MBE) processes. The sidewall geometry may be particularly useful for embedding the EVPD, for example, in a polymer lightwave circuit and for more convenient alignment to optical fibers. In optoelectronic packaging for the telecommunication industry, the EVPD, for example, may be fitted with a "V-groove" on a lower mesa to facilitate direct optical fiber coupling without using additional components such as mirrors and lenses.

Accordingly, embodiments of the invention may provide, for example, a method for greatly increasing the sensitivity and temporal response for EVPDs. Furthermore, embodiments of the invention may provide a method for the rapid and precise EVPD alignment with respect to polymer optical waveguides in lightwave circuits. In addition, embodiments of the invention may provide a method for the simplified optical packaging and alignment between optical fibers and PDs. Moreover, embodiments of the invention may provide a method for decreasing feedback noise that may be caused by back reflected light from a PD into a laser waveguide.

Figure 1:
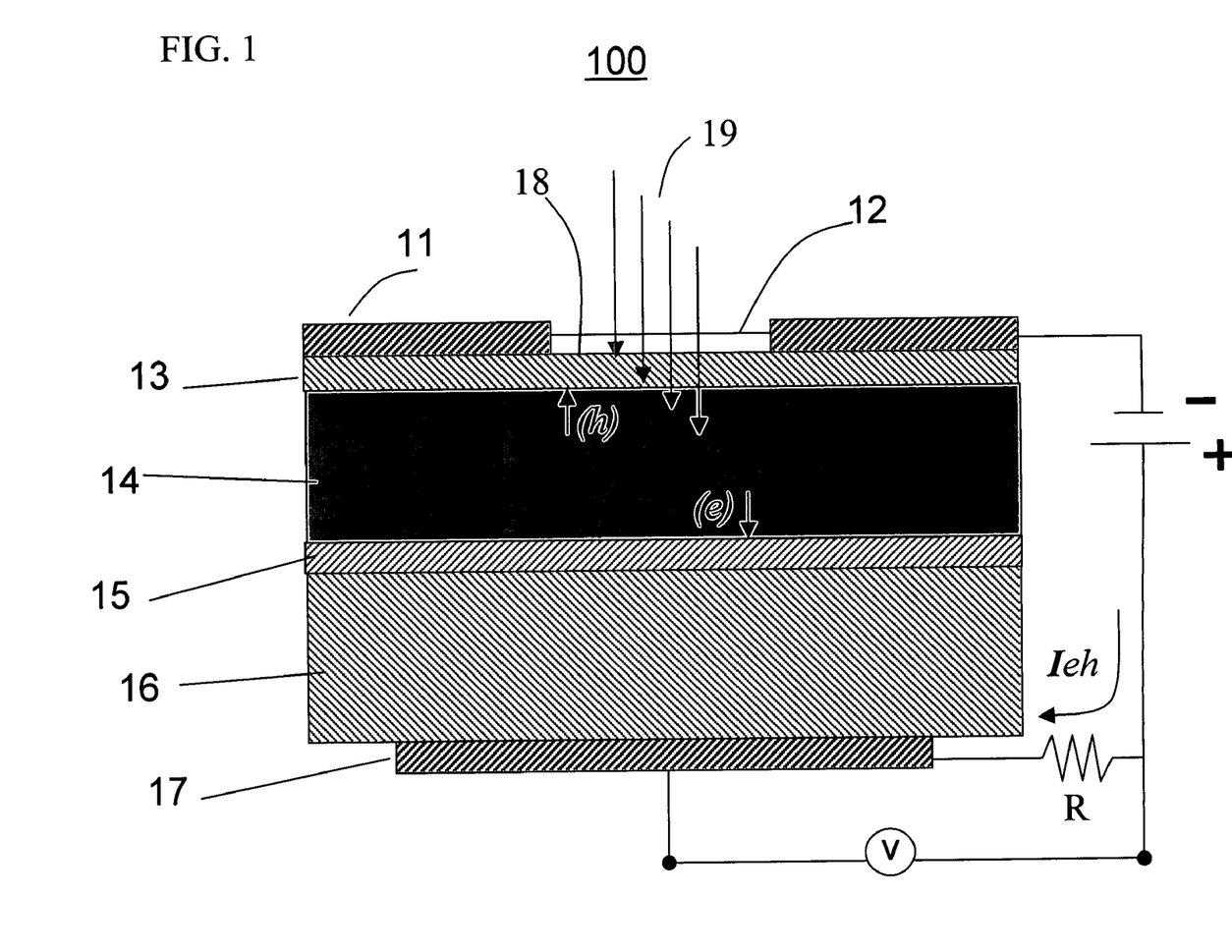
FIG. 1 is a cross-section view of a P-I-N layer structure for generating a photo-ionization current and a light entry facet formed in a plane that is parallel to the planes of electrical contact pads and to a plane of the P-I-N layer structure.

FIG. 1 is a cross-section view of a P-I-N layer structure 100 for generating a photo-ionization current and a light entry facet formed in a plane that is parallel to planes of electrical contact pads and to a plane of P-I-N layer structure 100. As shown in FIG. 1, a first layer 13 may be a p-type layer and a second layer 15 may be an n-type layer. These layers may be used to generate a static electric field in an intrinsic layer 14 in order to accelerate and efficiently collect the electron (e) and hole (h) charge currents generated by the photo ionization process that occurs mostly in intrinsic layer 14 due to incident sufficient energy photons. The incident light may be represented by a group of four arrows 19 incident on an entry facet 18. As the P-I-N layers are very thin, these are normally formed on a substrate 16 of chemical doping type similar to second layer 15. An anti-reflection layer 12 may be formed on first layer 13 and intrinsic layer 14 that may also be used to adjust the spectral detection width by adjusting the semiconductor band-gap with appropriate semiconductor alloying. Metallic electrical contacts 11 and 17 may be used to connect to external instrumentation to apply an external accelerating electric field and to detect the ionization current in a number of ways. One process for measuring the photo-current, $I_{eh}$, is shown in FIG. 1 that uses a resistor R across which is measured an electrical potential, V.

Because P-I-N PDs may be used in many applications, numerous attempts have been made to adapt their light detection efficiency for specific applications. Thus, while structure 100 in FIG. 1 has a "top-viewing" light entry facet, structure 100 may be easily adaptable to a "bottom-viewing" light entry facet configuration. In both cases, a light plane entry facet may be parallel to a plane of a P-I-N layer structure and to an electrical contacts plane.

Figure 2:
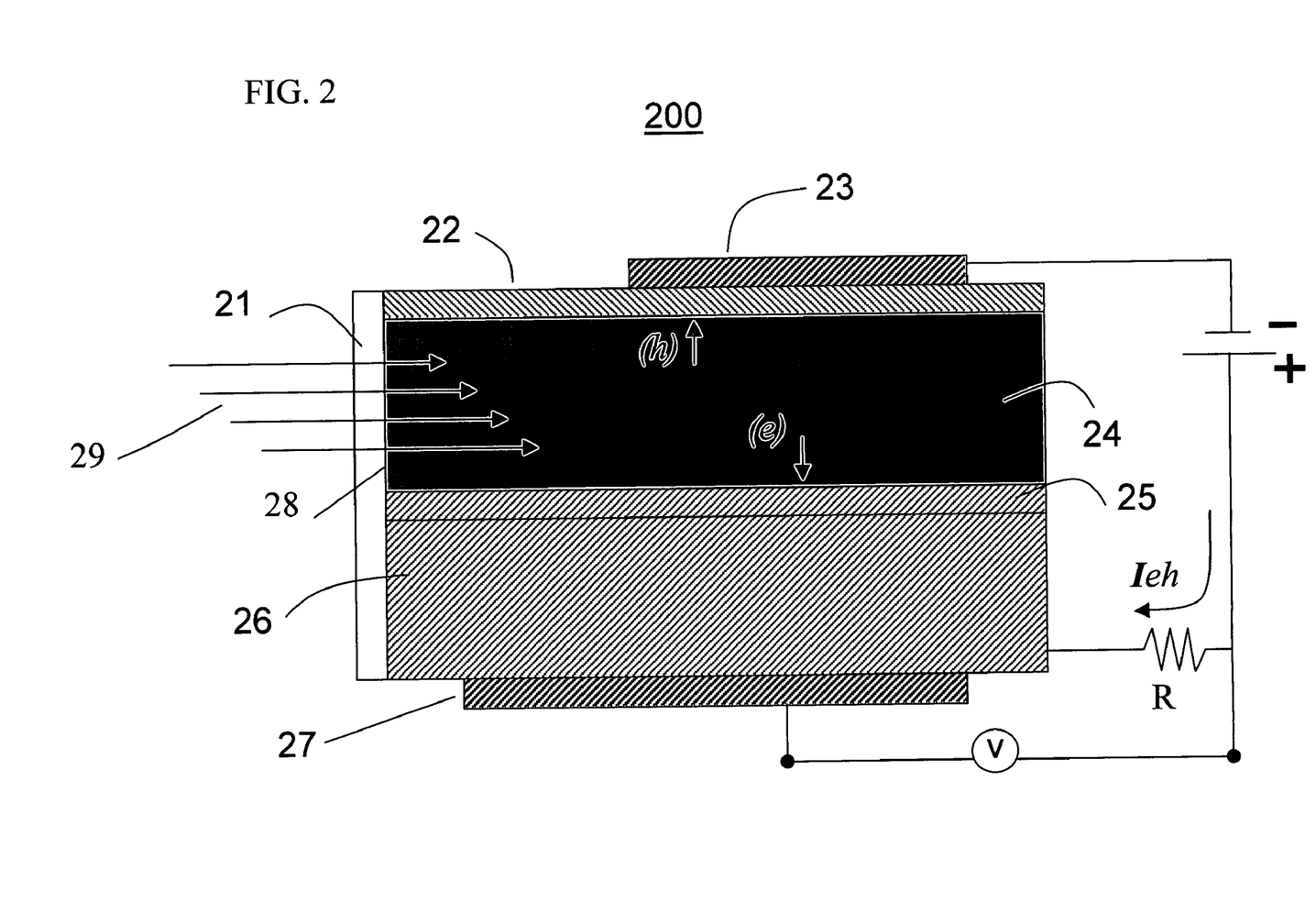
FIG. 2 is a cross-section view of a P-I-N layer structure for generating a photo-ionization current wherein a layer structure additionally serves to guide light to a current detection region from a light entry facet that is formed in a plane that is substantially perpendicular to planes of the electrical contact pads and the P-I-N layer structure.

FIG. 2 is a cross-section view depicting a P-I-N layer structure 200 for generating a photo-ionization current wherein a layer structure additionally serves to guide light to a current detection region from a light entry facet. The light entry facet may be formed in a plane that is substantially perpendicular to planes of the electrical contact pads and the P-I-N layer structure. As sown in FIG. 2, the light entry facet may be planar and perpendicular to the planes of the P-I-N structure and electrical contacts. The semiconductor layer structure may be similar to that in structure 100 wherein a layer 22 may be a p-type layer, a layer 24 may be an intrinsic layer, a layer 25 may be the n-type layer, and a layer 26 is a substrate. Metal electrical contacts are 23 and 27 and the photo-current may be registered as described above with respect to FIG. 1. An antireflection coating 21 may be formed on a side light entry facet 28 and light, represented by four arrows 29 may be guided to an electrical current collection region under metal contact 23 by a waveguide structure defined by layers 22, 24, and 25 (and possibly additional layers.) Light may be absorbed and may generate mobile electrons and holes through its path in layer 24. This type of PD may be called a "waveguide P-I-N PD." A waveguide P-I-N PD may be designed to be used in cases where light may be propagating in a plane that may be parallel to the plane of the P-I-N layer structure and it may not be convenient to re-orient or otherwise guide light to an entry facet of a top-viewing or bottom-viewing PD.

Figure 3:
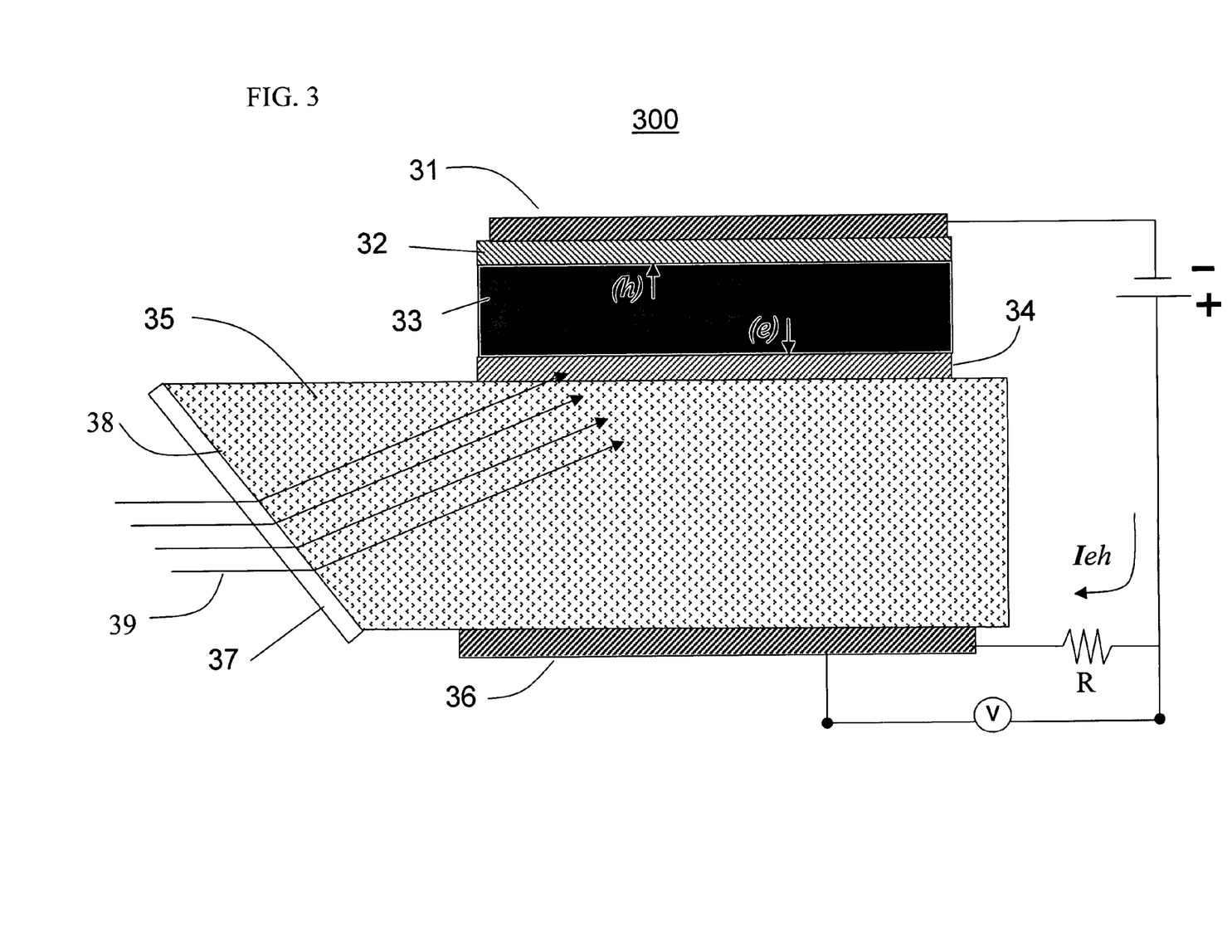
FIG. 3 is a cross-section of a P-I-N layer structure for generating a photo-ionization current and an oblique light entry facet formed in a plane that is oblique to planes of the electrical contact pads and the P-I-N layer structure.

FIG. 3 is a cross-section of a P-I-N layer structure 300 for generating a photo-ionization current and having an oblique light entry facet formed in a plane that is oblique to planes of the electrical contact pads and the P-I-N layer structure. As shown in FIG. 3, structure 300 may comprise an EVPD. Again, a goal may be to detect light that is propagating in a plane that is parallel to the plane of the P-I-N layer structure when it is not convenient to re-orient or otherwise guide light to an entry facet of a top-viewing or bottom-viewing PD. As shown in FIG. 3, light may be guided to an intrinsic layer photo-ionization region and electrical charge collection region by a refracting entry facet 38 with an anti-reflection coating 37. An incident light path may be represented by four arrows 39. The P-I-N photo-ionization and electrical charge detection structure is again similar to that shown in FIG. 1. Layers 32, 33 and 34 may be the p-type layer, the intrinsic-layer, and the n-type layer respectively. Top and bottom metal contacts are 31 and 36 respectively. Substrate 35 may be the same type as layer 34.

Figure 4A:
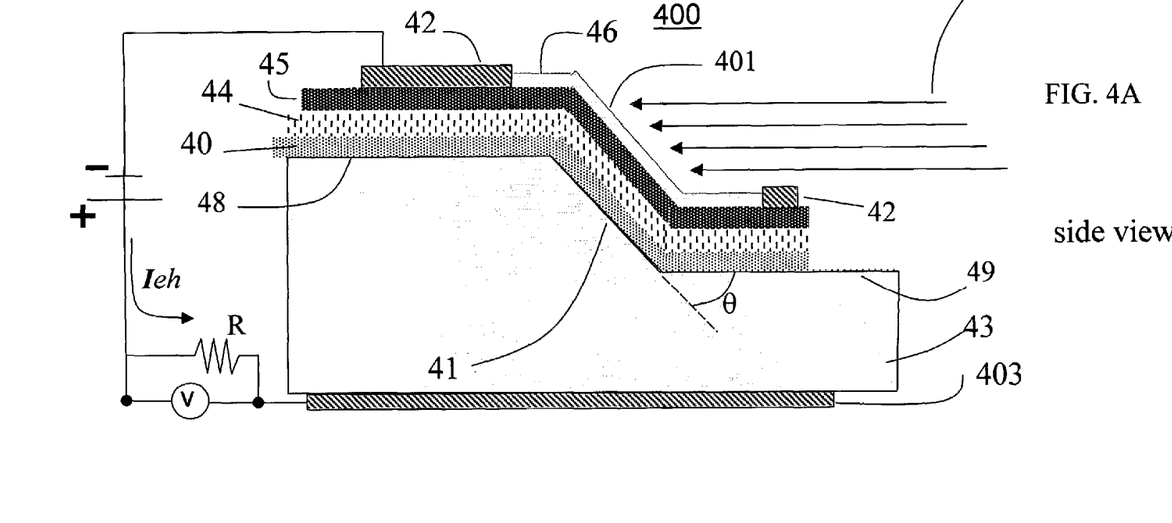
FIG. 4A is a cross-section view of an EVPD structure having a light entry facet and P-I-N layer structure that are formed in a plane that is oblique to a plane of the electrical contact pads.
Figure 4B:
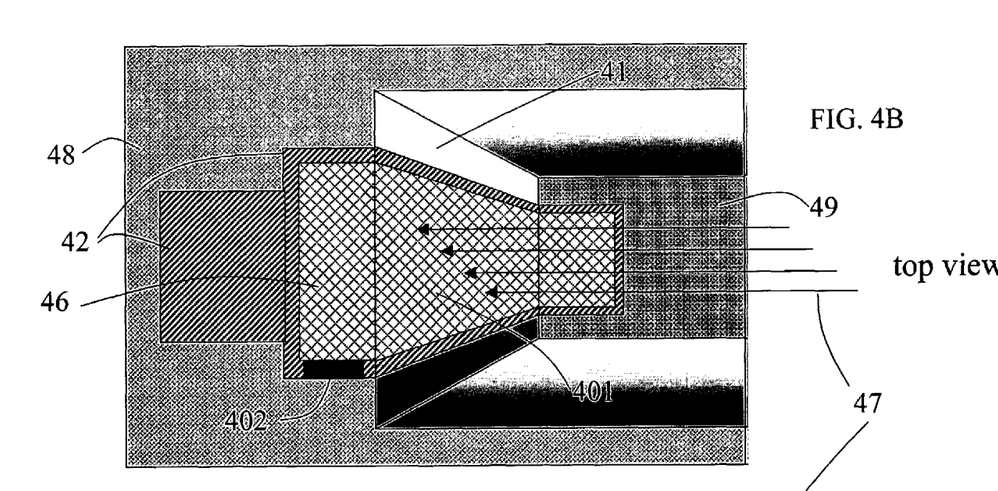
FIG. 4B shows a top view of the same EVPD structure of FIG. 4A.

FIG. 4A is a cross-section view of an EVPD structure 400 having a light entry facet and P-I-N layer structure that may be formed in a plane that may be oblique to a plane of the electrical contact pads. FIG. 4B shows a top view of EVPD structure 400 of FIG. 4A. FIGS. 4A and 4B illustrates a P-I-N layer structure for generating a photo-ionization current and a light entry facet, both that may be formed on a sidewall of a purposely fabricated mesa structure. The mesa wall may be formed by anisotropic chemical etching in a liquid solution and may be oblique to the planes of the electrical contact pads. Thus, with embodiments of the present invention, the plane of the P-I-N layer structure may be parallel to the plane of the light entry facet. For example, and in contrast to conventional systems, both planes may be inclined to the direction of incident light and inclined to the plane of the electrical contact pads. Thus a layer 45 may be a p-type layer, a layer 44 may be an intrinsic-type layer, and a layer 40 may be an n-type layer. A layer 46 may be an antireflection layer. A substrate 43 may also be n-type. The P-I-N layers continuously extend from a portion of a top mesa 48, a mesa wall 41, and a lower mesa 49. Light, as represented by four arrows 47, may be incident on a light entry facet 401 on mesa wall 41. Most of the photo-ionization may occur in intrinsic layer 44. As shown in FIG. 4B, top electrical contact pad 42 makes electrical contact with the p-type layer all around a perimeter on the top mesa 48, mesa wall 41, and lower mesa 49 except for an open segment 402 that may be placed anywhere along that periphery. Bottom n-type contact is 403. An angle θ of mesa wall 41 may be determined by the liquid anisotropic etching conditions and may be generally in the range of approximately 54.7 degrees but is not limited to this value. An external electrical circuit for detecting the ionization current $I_{eh}$ may be similar to that shown in FIG. 1.

Figure 5A:
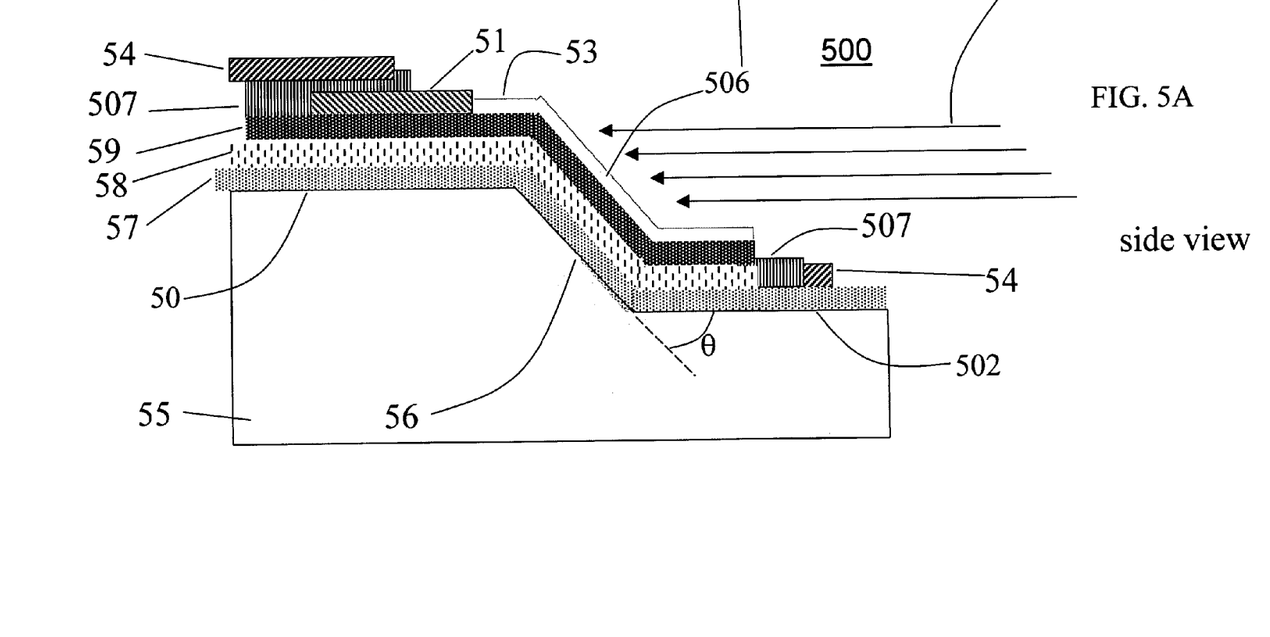
FIG. 5A is a cross section view of an EVPD structure having a light entry facet and P-I-N layer structure that are formed in a plane that is oblique to a plane of the electrical contact pads.
Figure 5B:
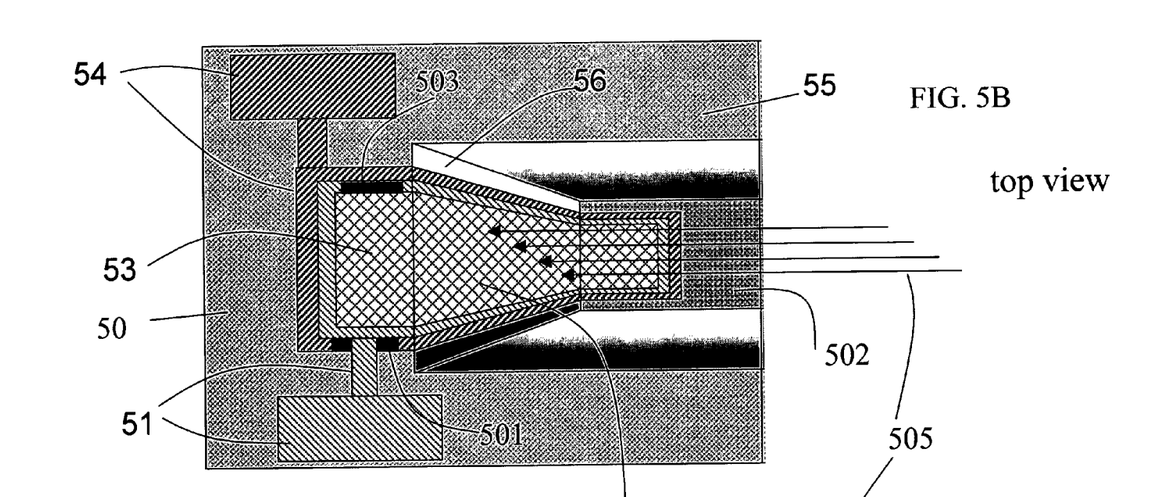
FIG. 5B shows a top view of the same EVPD structure of FIG. 5A.

FIG. 5A is a cross section view of an EVPD structure 500 having a light entry facet and P-I-N layer structure that may be formed in a plane that may be oblique to a plane of the electrical contact pads. FIG. 5B shows a top view of EVPD structure 500 of FIG. 5A. Consistent with embodiments of the invention, both electrical contacts 54 and 51 may be formed on a top mesa 50. Layers 59, 58, and 57 may be p-type, i-type, and n-type semiconductor layers, respectively, that may compose the P-I-N structure of this embodiment. The aforementioned P-I-N layers may continuously extend from a portion of top mesa 50, a mesa wall 56, and a lower mesa 502. An electrical contact pad 51 may make metallic contact all around the periphery of p-type layer 59 on top mesa 50, mesa side wall 56, and a mesa bottom 502. An insulating gap 503 may be formed in contact metallurgy 51. Similarly, an electrical contact pad 54 may make metallic contact all around the perimeter of n-type layer 57 on top mesa 50, mesa side wall 56, and mesa bottom 502. An insulating gap 501 may be formed in contact metallurgy 54. An insulating layer 507 may ensure that the two top electrical contact pads are isolated from one another. Light, as represented by four arrows 505, may be incident on a light entry facet 506 on mesa wall 56 with most of the photo-ionization occurring in intrinsic layer 58. An antireflection layer 53 may minimize reflection losses. Angle may θ carry the same meaning as in FIG. 4A.

Figure 6:
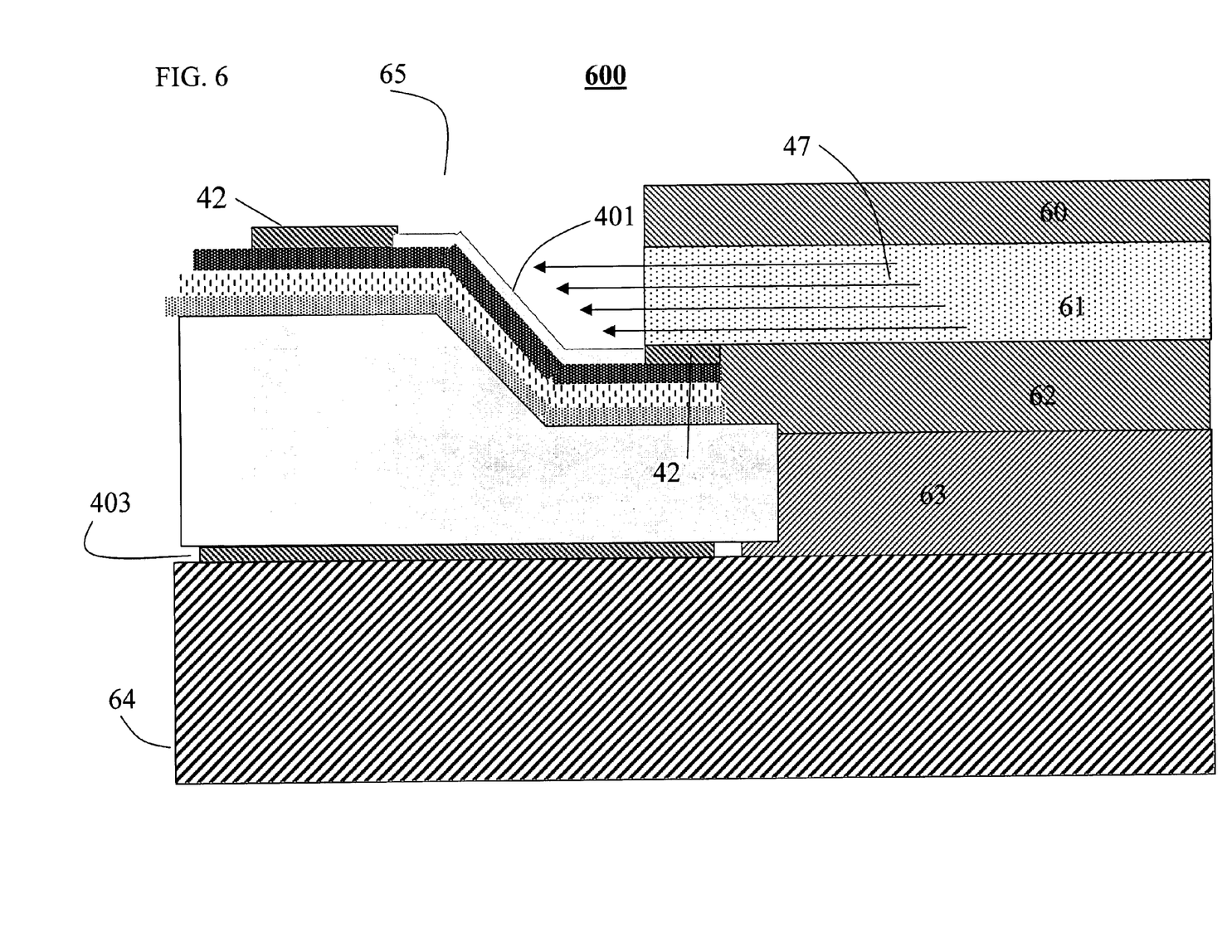
FIG. 6 shows a direct end-coupling of an EVPD structure to a polymer waveguide.

FIG. 6 shows a direct end-coupling of an EVPD structure 65 to a polymer waveguide. For example, embodiments of the present invention may include a method of use in which a method for direct coupling an EVPD to polymer waveguides. FIG. 6 shows a cross section 600 consistent with embodiments of the invention for coupling EVPD 65 to a polymer waveguide. EVPD 65 may be electrically connected to a substrate electrical circuit 64 by a bottom electrical contact 403. A buffer layer 63 may be formed on substrate 64. A lower cladding layer 62, a waveguide core 61, and a top cladding layer 60 may be formed on buffer layer 63. Light that may be guided by core 61 may be incident on oblique light entry facet 401. Consistent with embodiments of the invention, light that my be reflected from EVPD 65's surface may be reflected away from optical waveguide core 61 and may not find its way back through waveguide core 61 to a laser source. Rather, the reflected light may enter a laser waveguide cavity and increase laser instability and cause noise. Furthermore, consistent with embodiments of the inventions, there may be no need for light steering mirrors and light collimating or focusing lenses.

Figure 7:
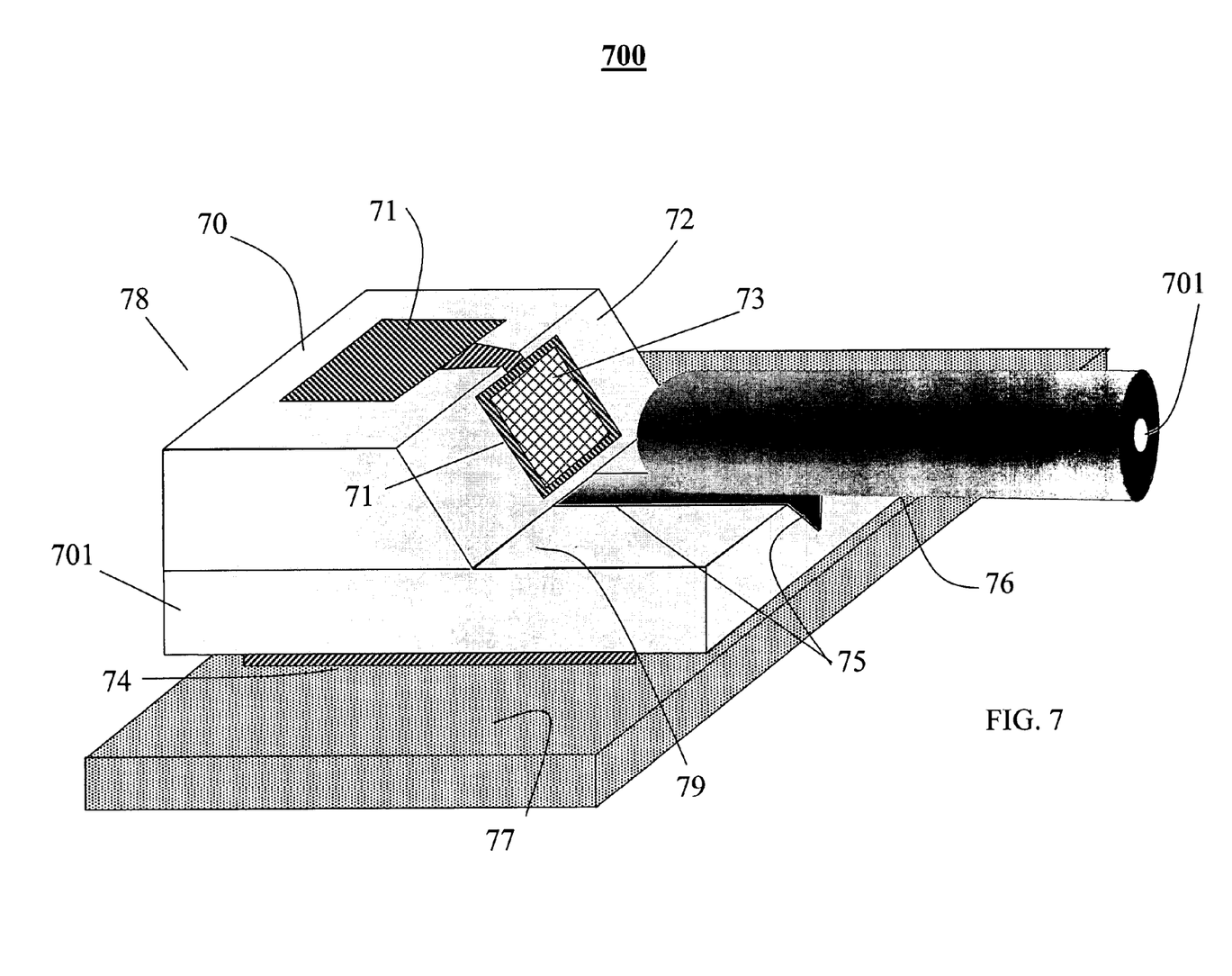
FIG. 7 shows a direct end-coupling of an EVPD structure to an optical fiber by a "V-groove" formed directly on, or attached to, the PD.

FIG. 7 shows a direct end-coupling of an EVPD structure 78 to an optical fiber by, for example, a "V-shaped" or "U-shaped" groove or cavity formed directly or indirectly on a PD. The "V-shape" and "U-shape" are examples and other shapes may be used. The "V" or "U" groove may be fabricated on a different substrate to which the PD is bonded. The perspective 700 in FIG. 7 is consistent with embodiments of the invention for coupling EVPD 78 to an optical fiber 76. EVPD 78 may be electrically connected to a substrate 77 via a bottom contact 74. A top electrical contact 71 may be formed on a top mesa 70. Contact 71 may make electrical contact with a periphery of a p-layer as it may extend onto a mesa wall 72 around a light entry surface area 73 just above a P-I-N photo-ionization area. A cavity 75 (e.g. "V" or "U" shaped) may be formed on a lower mesa 79 or EVPD 78 may be lithographically aligned and attached to a substrate having pre-fabricated cavities. An optical fiber 76 may be aligned in place by, for example, "V" or "U" shaped cavity 75. A fiber core 701 may be aimed directly at light entry surface area 73. Consistent with embodiments of the present invention, light that may be reflected from EVPD 78's surface may be reflected away from optical fiber core 701. Consequently, this light may not find its way back through the fiber to a laser source where the reflected light may increase laser instability and cause noise. Consistent with embodiments of the present invention, there may be no need for light steering mirrors and light collimating or focusing lenses.

Figure 8:
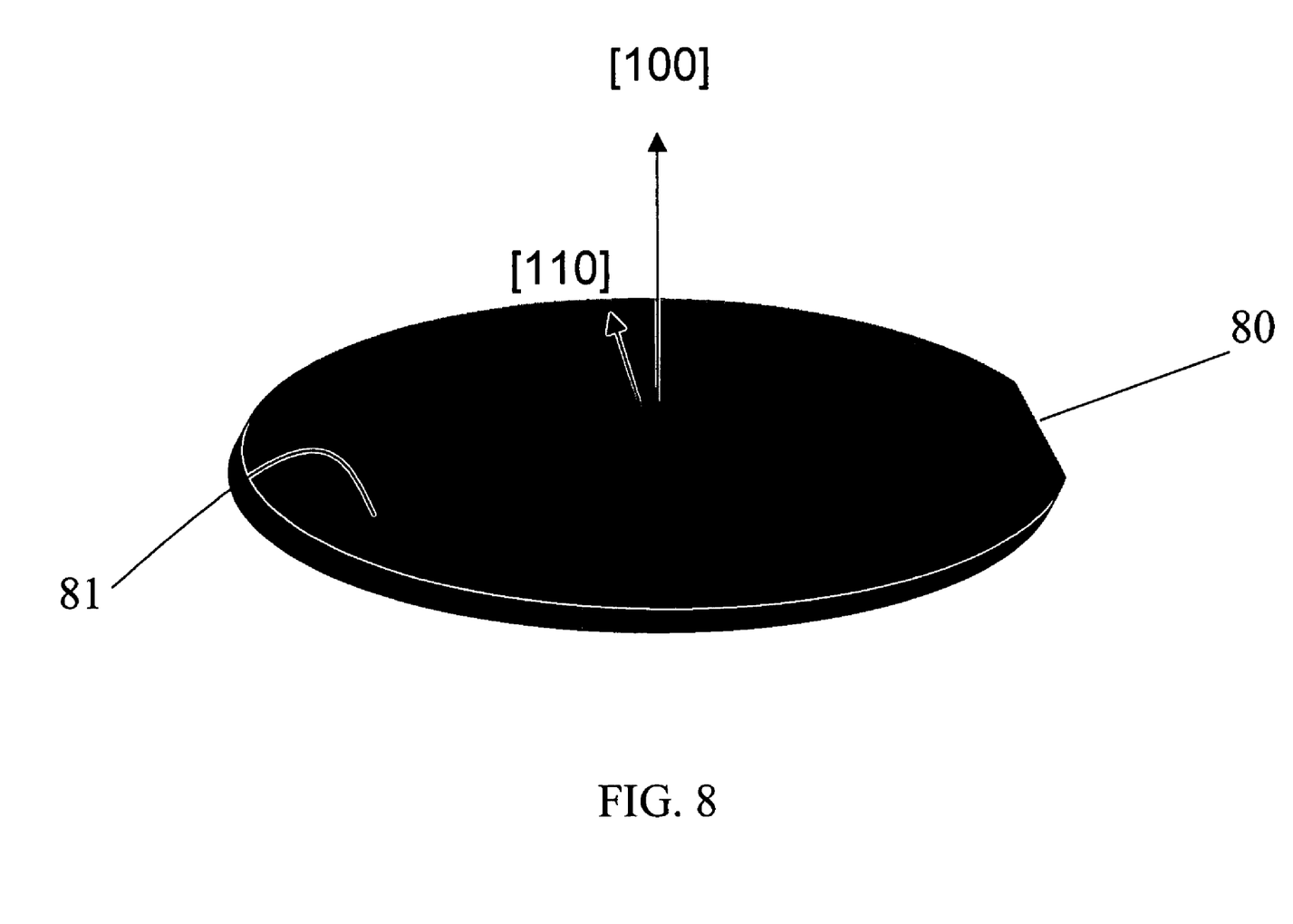
FIG. 8 shows an orientation of a semiconductor substrate for the fabrication of an EVPD structure.

FIG. 8 shows an orientation of a semiconductor substrate for the fabrication of an EVPD structure. A method for constructing an EVPD consistent with embodiments of the present invention may begin by orienting a principal crystal directions of a crystalline semiconductor substrate material wafer with respect to a lithographic mask. As shown in FIG. 8, a semiconductor material may be shaped in the form of a wafer. The semiconductor material may comprise, but is not limited to, gallium arsenide (GaAs), indium phosphide (InP), and Silicon, for example. All three of the aforementioned semiconductors may have a cubic crystal structure. A wafer 81 may be constructed so that the principal cubic crystal directions may be defined by knowledge of the surface orientation and a flat edge 80. In this case, one may start with a wafer whose surface is in the [100]-type crystal direction and the flat may be aligned in a [110]-type crystal direction. A lithographic mask having rectangular features may be aligned with one side of a features parallel to the [110] direction.

Figure 9:
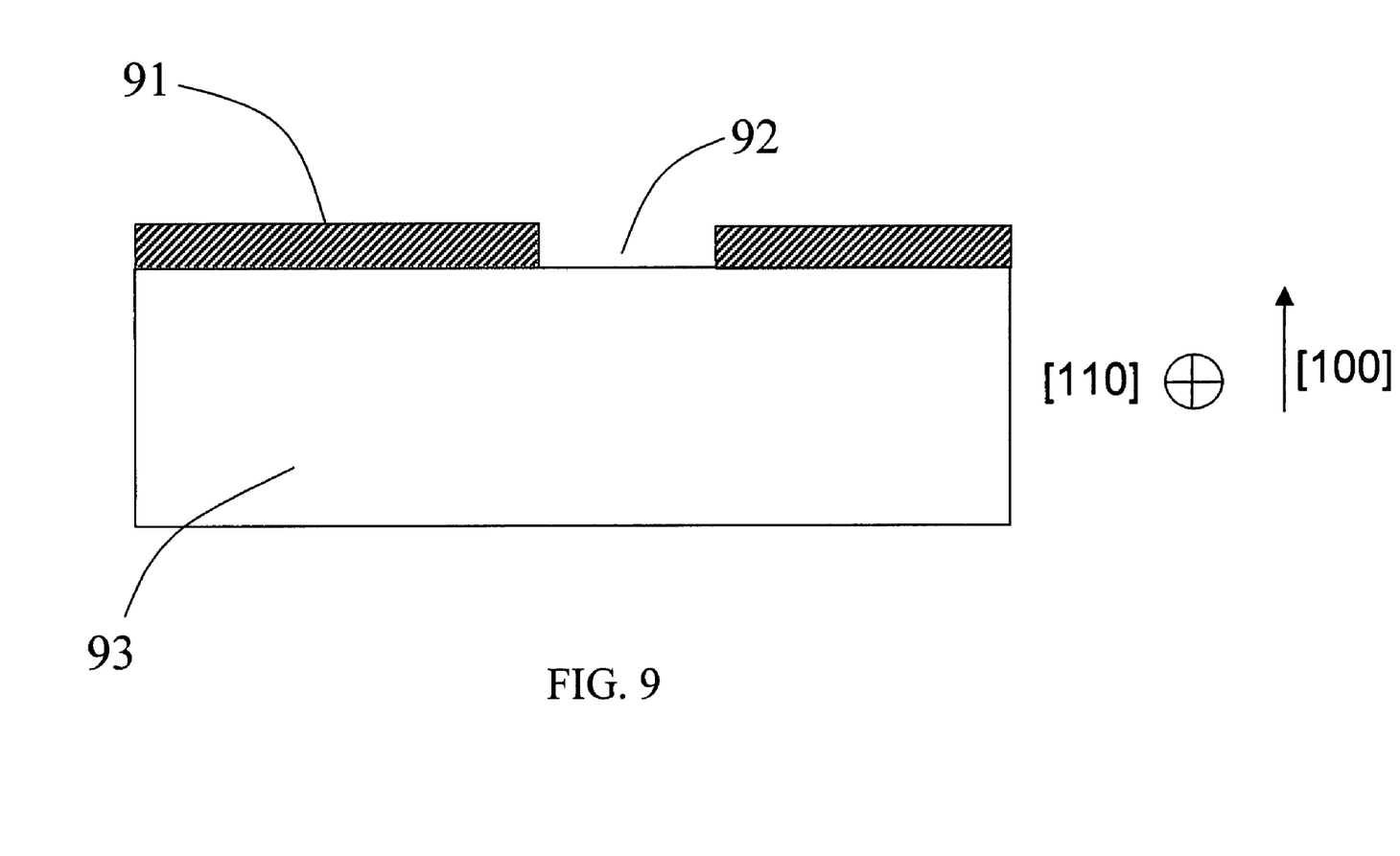
FIG. 9 shows a first process stage for the fabrication of an EVPD structure.

FIG. 9. shows a first process stage for the fabrication of an EVPD structure consistent with embodiments of the present invention. For example, a relative orientation of one rectangular lithographic feature with respect to the major cubic directions is shown in FIG. 9. A hard mask 91 may be formed on a semiconductor substrate 93 that may be an n-type semiconductor. A rectangular opening 92 may be formed in the hard mask. The semiconductor substrate with the hard mask and the rectangular opening may be exposed to a liquid that may cause the semiconductor to be etched so that the rate of material removal may be dependent on the crystal plane that may be exposed to the etchant solution. The etching, for example, may proceed more rapidly in a [110]-type direction, followed by a [100]-type direction, then followed by a [111]-type direction as discussed and demonstrated in many books and articles, in particular, in the publication by Sadao Adachi and Kunishige Oe, entitled "Chemical etching characteristics of (001) GaAs" which appears in the Journal the Electrochemical Society (USA): Solid State Science and Technology, Volume 130, No. 12, pp. 2427-2435, published in 1983.

Figure 10A:
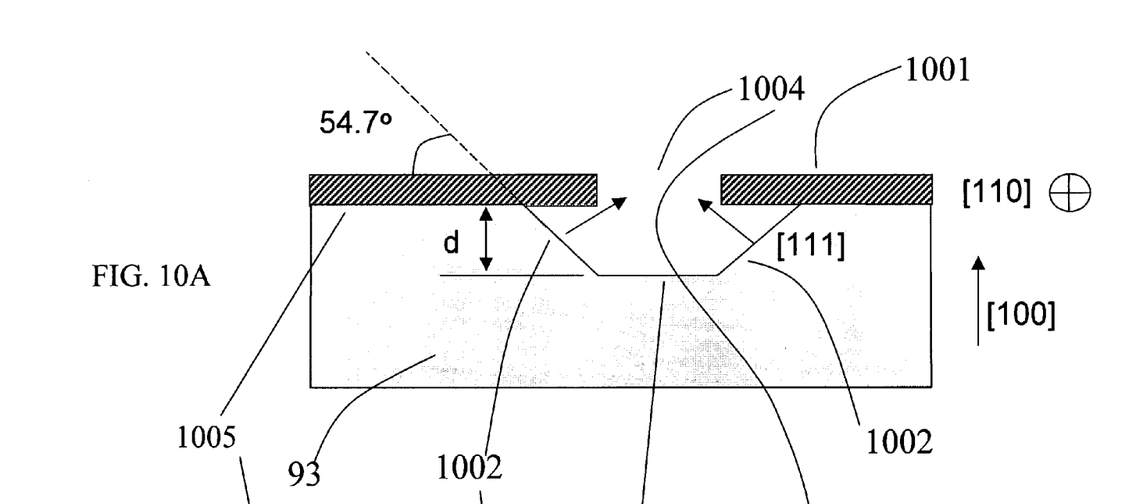
FIG. 10A shows a second process stage for the fabrication of an EVPD structure.
Figure 10B:
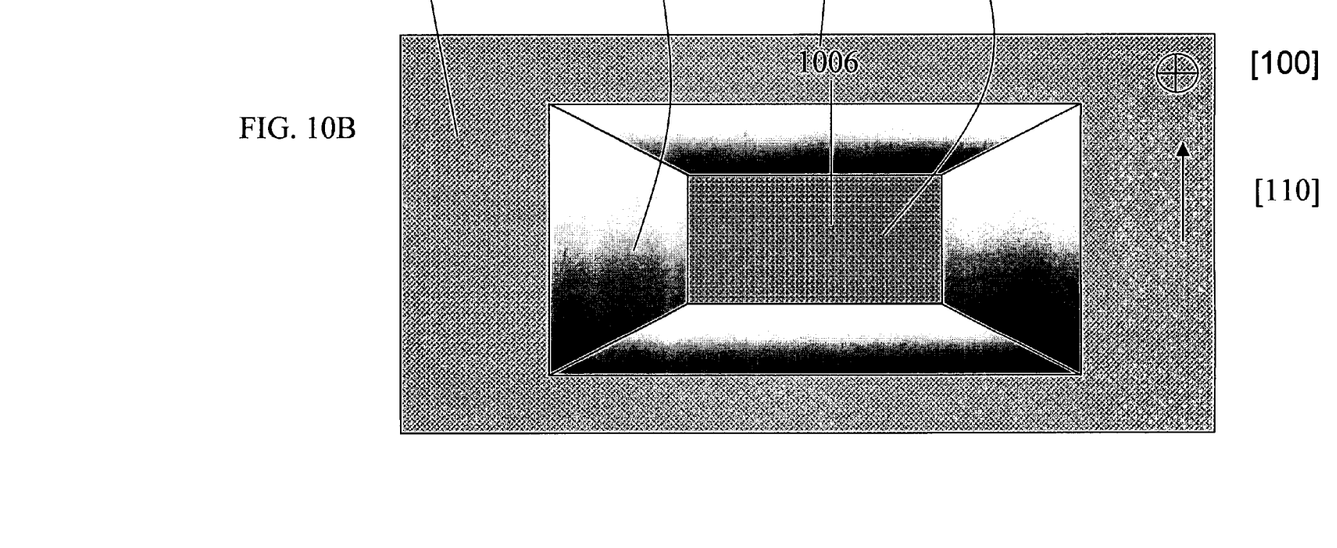
FIG. 10B shows a top view of the same structure of FIG. 10A.

FIG. 10A shows a second process stage for the fabrication of an EVPD structure. FIG. 10B shows a top view of the same structure of FIG. 1A. A result of this second process stage may be shown in the cross section shown in FIG. 10A and the top view shown in FIG. 10B. A rectangular mesa opening 1004 may be formed having a top mesa 1005, a bottom mesa 1006, and mesa walls, one of which is indicated by as mesa wall 1002. A surface normal to the mesa walls may be parallel to a [111]-type direction and may intersect a [100]-type direction at an angle, for example, of approximately 54.7 degrees. A mesa wall thus etched in heteropolar semiconductors may be a polar plane and can support a diapole layer near the surface. The planar dimensions of bottom mesa 1006 may be substantially of a rectangular mask opening. The depth of the mesa structure may be determined by the length of time that the semiconductor substrate 93 may be exposed to the etching solution, temperature, and the composition of the etchant solution. The mesa etching process may be followed by mask removal and a epitaxial growth of a P-I-N structure.

Figure 11:
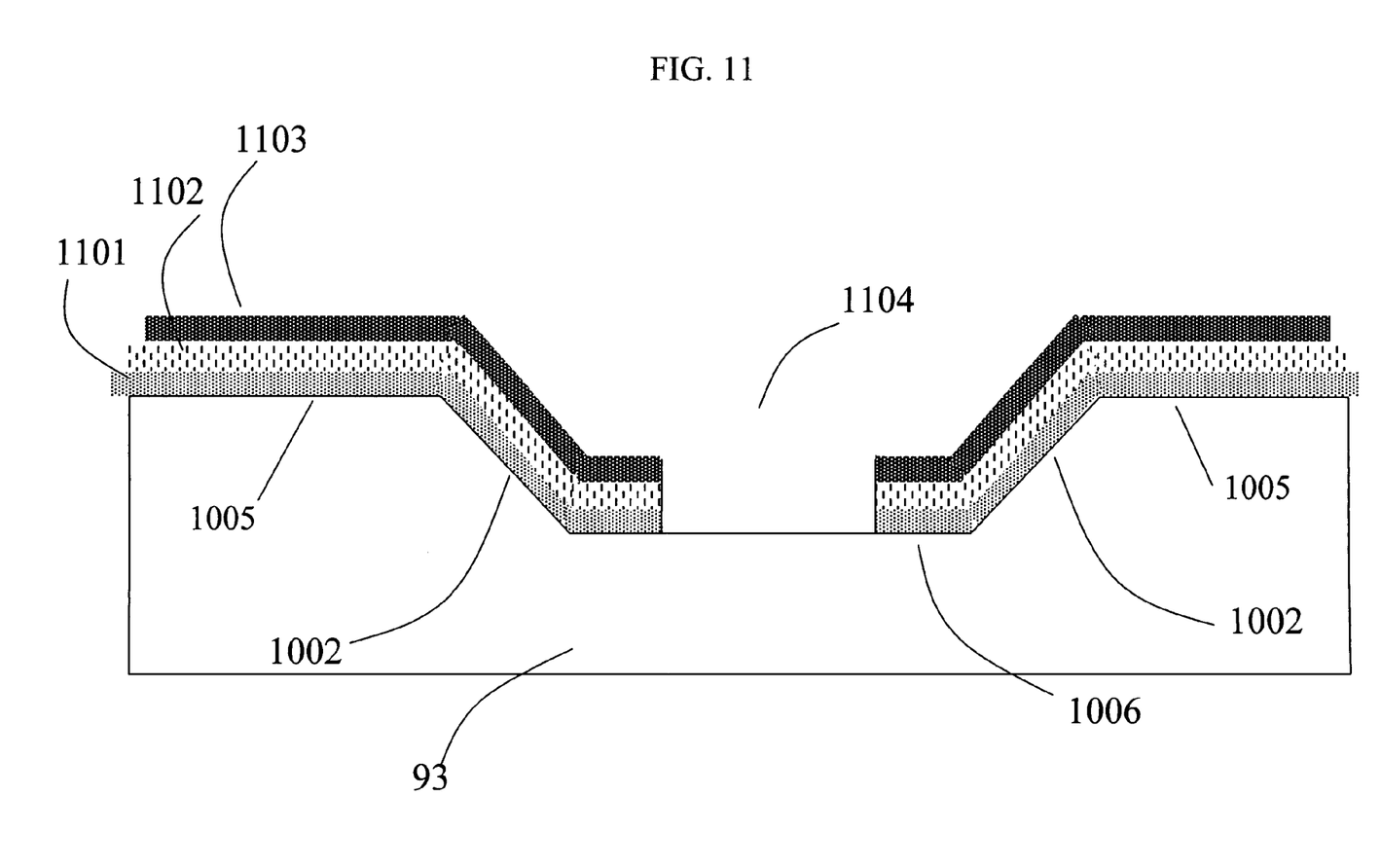
FIG. 11 shows a third process stage for the fabrication of an EVPD structure.

FIG. 11 shows a third process stage for the fabrication of an EVPD structure. The cross section shown in FIG. 11 may depict the cross section of a mesa structure in a n-type material 93. On the mesa structures are then grown an n-type layer 1101, an intrinsic layer 1102, and a p-type layer 1103. In particular, the layer sequence may also be formed on mesa walls 1002. A gap 1104 in the layer sequence may be formed on the lower mesa 1006.

Figure 12:
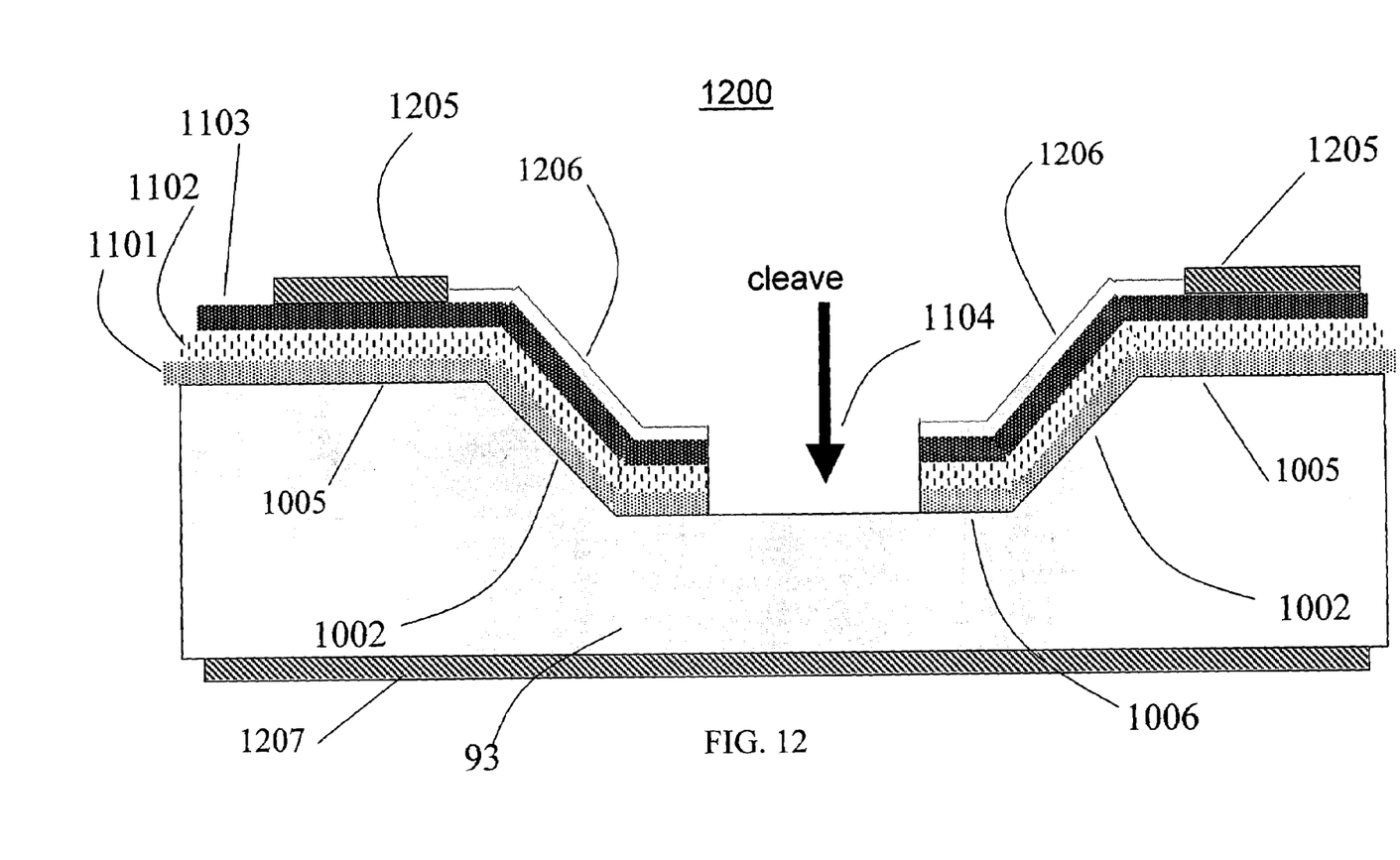
FIG. 12 shows a fourth process stage for the fabrication of an EVPD structure.

FIG. 12 illustrates a fourth process stage for the fabrication of an EVPD structure. FIG. 12 shows a cross section view 1200 of the structure when the fabrication sequence is completed. An antireflection coating layer 1206 may be added to minimize reflection losses, and a top electrical contact 1205 and a bottom electrical contact 1207 may be added in order that the device be conveniently used. The final stage may be to cleave the bottom mesa to produce individual or linear arrays of EVPDs.

Consistent with embodiments of the inventions, an active area of a semiconductor PD may comprise an area within which incident quanta of light, having sufficient energy, ionize a portion of the semiconductor material by an internal ionization process and creates mobile electron-hole pairs which are then collected and measured by appropriate conducting electrodes. Furthermore, a polar plane in a heteropolar semiconductor may comprise a plane that may be populated, for example, by one atomic specie comprising the heteropolar semiconductor crystal lattice.

Embodiments of the present invention, for example, are described above with reference to block diagrams and/or operational illustrations of methods, systems, and computer program products according to embodiments of the invention. The functions/acts noted in the blocks may occur out of the order as show in any flowchart. For example, two blocks shown in succession may in fact be executed substantially concurrently or the blocks may sometimes be executed in the reverse order, depending upon the functionality/acts involved.

While certain embodiments of the invention have been described, other embodiments may exist. Also, while the specification includes examples, the invention's scope is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A system for providing light detection, the system comprising:
   a contiguous semiconductor volume;
   a plurality of surface area segments on the contiguous semiconductor volume, at least one of the plurality of surface area segments being an optically active surface area segment comprising at least one optically active area and at least one of the plurality of surface area segments being adjacent to the at least one of the plurality of optically active surface area segments;
   at least one intersection angle between the at least one of the plurality of optically active surface area segments and the at least one of the plurality of adjacent surface area segments respectively, none of the at least one intersection angle being substantially equal to one of the following: 0 degrees, 90 degrees, and 180 degrees; and
   at least one electrically conductive line being connected to at least one optically active area on at least one of the plurality of optically active surface area segments and extending to the at least one of the plurality of surface area segments being adjacent to the at least one of the plurality of optically active surface area segments.

2. The system of claim 1, wherein at least one of the plurality of optically active surface area segments and at least two of the plurality of adjacent surface area segments are substantially planar.

3. The system of claim 2, wherein the at least two of the plurality of adjacent surface area segments are substantially horizontal.

4. The system of claim 2, wherein the at least one of the plurality of optically active surface area segments is substantially oblique to the at least two of plurality of adjacent surface area segments.

5. The system of claim 1, wherein an electrical contact extends from a first one of the plurality of optically active surface areas on a first one of the plurality of optically active surface area segments to a first one of the plurality of adjacent surface area segments and to a second one of the plurality of the next distant adjacent surface area segments.

6. The system of claim 1, wherein the at least one of the plurality of optically active surface areas on a first one of the plurality of optically active surface area segments and electrical contacts are formed on non-parallel surface segments.

7. The system of claim 1, wherein angles of intersection between the at least one of the plurality of optically active surface area segments and each one of the plurality of adjacent surface area segments are formed by an intersection of crystallographic planes of the substantially single crystal lattice that comprises the semiconductor volume.

8. A photodetector comprising:
   a heteropolar semiconductor;
   an optically active volume;
   at least one polar plane on the heteropolar semiconductor wherein an optically active surface area of the optically active volume resides;
   at least one surface area adjacent to the optically active area wherein the at least one surface area adjoins the optically active area at an angle substantially different from at least one of the following: 0, 90, and 180 degrees; and electrical contact pads making electrical contacts to the active area, wherein at least one electrical contact pad extends to the optically active area from the surface area adjacent to the optically active surface area of the optically active volume.

9. An apparatus for providing light detection, the apparatus comprising:
- a semiconductor device comprising a plurality of layers, wherein the layers comprise:
  - a substrate layer,
  - an n-type layer,
  - a p-type layer, and
  - an intrinsic layer;
- a first electrical contact arranged on a first surface plane of the semiconductor device;
- a second electrical contact, wherein the first and second electrical contacts are operable to apply an external accelerating electric field;
- a light entry facet formed in a second surface plane at an angle to the first surface plane of the first electrical contact, wherein the angle does not comprise at least one of the following: 0, 90, and 180 degrees;
- the second electrical contact arranged to extend from a third surface plane of the semiconductor device to the second surface plane adjacent to the third surface plane,
- the second electrical contact making contact with the light entry facet in the second surface plane;
- the second electrical contact further extending to a fourth surface plane parallel to the first and third surface planes, wherein the first, third, and fourth surface planes are substantially horizontal; and
- the apparatus being operable to generate a photo-ionization current.

10. The apparatus of claim 9, further comprising an anti-reflective layer operable to adjust a spectral detection width.

11. The apparatus of claim 9, wherein the semiconductor device comprises a mesa structure formed by an isotropic chemical etching.

12. The apparatus of claim 9, wherein the apparatus is operable to directly connect to a waveguide by an end-optical coupling.

13. The apparatus of claim 9, wherein the electrical contacts generate a static electrical field in the intrinsic layer.

14. The apparatus of claim 9, wherein the angle of incidence of the first and second surface planes comprises 54.7 degrees.

15. The apparatus of claim 12, further comprising a cavity formed in a layer of the device and operable to align an optical fiber.

16. The apparatus of claim 9, wherein the surface of the apparatus is operable to reflect light not received through the light entry facet away from a light source.

17. The apparatus of claim 9, further comprising a plurality of semiconductor devices separately operable to provide light detection.

18. The apparatus of claim 17, wherein the first electrical contact is contiguous across the plurality of semiconductor devices.

19. The apparatus of claim 17, wherein the substrate layer is contiguous across the plurality of semiconductor devices.

20. The apparatus of claim 17, wherein the plurality of semiconductor device comprise at least one pair of opposite-facing semiconductor devices, wherein the n-type layer, the p-type layer, and the intrinsic layer of each of the at least one pair of opposite facing semi-conducting devices is separated by a cleave.

* * * * *